United States Patent
Eitoku (10) Patent No.: US 8,118,945 B2
(45) Date of Patent: Feb. 21, 2012

(54) SUBSTRATE PROCESSING METHOD AND SUBSTRATE PROCESSING APPARATUS

(75) Inventor: Atsuro Eitoku, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 726 days.

(21) Appl. No.: 11/957,741

(22) Filed: Dec. 17, 2007

(65) Prior Publication Data

US 2008/0142054 A1 Jun. 19, 2008

(30) Foreign Application Priority Data

Dec. 18, 2006 (JP) ................................. 2006-340206

(51) Int. Cl.
*B08B 3/04* (2006.01)

(52) U.S. Cl. ................. 134/26; 134/2; 134/18; 134/19; 134/28; 134/30; 134/32; 134/33; 134/34; 134/35; 134/36; 134/37; 134/41; 134/42; 134/902

(58) Field of Classification Search ................ 134/2, 18, 134/19, 26, 28, 30, 32, 33, 34, 35, 36, 37, 134/41, 42, 902
See application file for complete search history.

(56) References Cited

U.S. PATENT DOCUMENTS

| | | | | |
|---|---|---|---|---|
| 5,858,106 A | * | 1/1999 | Ohmi et al. | 134/1 |
| 5,882,433 A | * | 3/1999 | Ueno | 134/31 |
| 6,119,366 A | * | 9/2000 | Ferrell et al. | 34/340 |
| 7,806,989 B2 | * | 10/2010 | Sekiguchi et al. | 134/30 |
| 2001/0047595 A1 | * | 12/2001 | Mehmandoust | 34/443 |
| 2002/0037371 A1 | | 3/2002 | Kumagai et al. | |
| 2002/0108642 A1 | * | 8/2002 | Ogasawara et al. | 134/102.1 |
| 2007/0289611 A1 | * | 12/2007 | Hayashi | 134/26 |

FOREIGN PATENT DOCUMENTS

| | | |
|---|---|---|
| JP | 4-97526 | 3/1992 |
| JP | 10-36894 | 2/1998 |
| JP | 2002-50600 | 2/2002 |
| JP | 2002-141326 | 5/2002 |
| JP | 2002-164316 | 6/2002 |
| JP | 2003-92280 | 3/2003 |
| JP | 2003-297794 | 10/2003 |
| JP | 2004-119717 | 4/2004 |
| JP | 2005-142290 | 6/2005 |
| WO | WO01/00338 A1 * | 1/2001 |

* cited by examiner

*Primary Examiner* — Bibi Carrillo
(74) *Attorney, Agent, or Firm* — Ostrolenk Faber LLP (57) ABSTRACT

A substrate processing method includes a cleaning processing step, a mixed organic solvent supplying step, and a fluorine organic solvent supplying step. The cleaning processing step is a step of cleaning a main surface of a substrate by supplying deionized water to the substrate. The mixed organic solvent supplying step is a step of supplying a fluid of a mixed organic solvent to the main surface of the substrate after the cleaning processing step. The fluid of the mixed organic solvent contains a fluid of a water-soluble organic solvent and a fluid of a fluorine organic solvent having a smaller surface tension than that of the deionized water and a lower water solubility than that of the fluid of the water-soluble organic solvent. The fluorine organic solvent supplying step is a step of supplying the fluid of the fluorine organic solvent to the main surface of the substrate without supplying the fluid of the water-soluble organic solvent after the mixed organic solvent supplying step.

12 Claims, 7 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus. Substrates subjected to processing include a semiconductor wafer, a substrate for liquid crystal display, a substrate for plasma display, a substrate for FED (Field Emission Display), an optical disk substrate, a magnetic disk substrate, a magneto-optical disk substrate, a photomask substrate, and a ceramic substrate.

2. Description of Related Art

In the production process of a semiconductor device and a liquid crystal display, processing using a processing solution is applied to a substrate, such as a semiconductor wafer and a glass substrate for liquid crystal display. To be more concrete, chemical processing is applied to the substrate by supplying a chemical to the main surface of the substrate followed by cleaning processing to cleaning away the chemical on the substrate by supplying deionized water to the main surface of the substrate to which the chemical is supplied.

The cleaning processing is followed by dry processing to dry the substrate by removing deionized water remaining on the substrate. As a method of performing the dry processing to dry the substrate, IPA (isopropyl alcohol), which is an organic solvent having higher volatility and smaller surface tension than deionized water, is applied to the main surface of the substrate after the cleaning processing for deionized water on the substrate to be substituted by IPA, after which IPA is removed from the substrate. See Japanese Unexamined Patent Publication No. 2003-92280.

However, because IPA is a water-soluble solvent, it mixes with deionized water freely, which makes the substitution of deionized water on the substrate by IPA incomplete. In other words, IPA remaining on the substrate contains a slight amount of moisture. When a solvent (IPA) having a high vapor pressure evaporates in this state, moisture having a low vapor pressure is left on the substrate. Such moisture gives rise to a pattern collapse caused by surface tension and a water mark.

Meanwhile, the same processing may be performed using a water-insoluble solvent, such as HFE (hydrofluoroether), instead of IPA. However, because it is difficult to let a water-insoluble solvent get into minute recess portions formed on the substrate. Accordingly, moisture on the substrate is not substituted by the water-insoluble solvent sufficiently, which possibly results in poor drying.

SUMMARY OF THE INVENTION

An object of the invention is to provide a substrate processing method and a substrate processing apparatus capable of drying the substrate while suppressing the occurrence of damage or poor drying.

A substrate processing method of the invention includes a cleaning processing step, a mixed organic solvent supplying step, and a fluorine organic solvent supplying step. The cleaning processing step is a step of cleaning a main surface of a substrate by supplying deionized water to the substrate. The mixed organic solvent supplying step is a step of supplying a fluid of a mixed organic solvent to the main surface of the substrate after the cleaning processing step. The fluid of the mixed organic solvent contains a fluid of a water-soluble organic solvent and a fluid of a fluorine organic solvent having a smaller surface tension than that of the deionized water and a lower water solubility than that of the fluid of the water-soluble organic solvent. The fluorine organic solvent supplying step is a step of supplying the fluid of the fluorine organic solvent to the main surface of the substrate without supplying the fluid of the water-soluble organic solvent after the mixed organic solvent supplying step.

According to the invention, a fluid of a mixed organic solvent containing a fluid of a water-soluble organic solvent and a fluid of a fluorine organic solvent having a smaller surface tension than that of deionized water and a lower water solubility than that of the fluid of the water-soluble organic solvent is supplied to the main surface of the substrate which has been subjected to the cleaning processing using deionized water. Accordingly, it is possible to substitute a liquid of the mixed organic solvent for deionized water remaining on the main surface of the substrate after the cleaning processing while dissolving the remaining deionized water into the fluid of the mixed organic solvent.

More predeterminedly, a fluid of the fluorine organic solvent alone cannot blend with deionized water. However, a fluid of a mixed organic solvent made by mixing a fluid of the fluorine organic solvent and a fluid of the water-soluble organic solvent can blend with deionized water. Hence, by supplying such a fluid of the mixed organic solvent to the substrate, it is possible to substitute the fluid of the mixed organic solvent for moisture on the substrate satisfactorily, for example, even in a case where recess portions or holes in a microscopic pattern are formed on the substrate.

By subsequently supplying the fluid of the fluorine solvent to the substrate without supplying the fluid of the water-soluble organic solvent, the fluid of the mixed organic solvent on the substrate is substituted by the fluid of the fluorine organic solvent. Because the fluid of the fluorine organic solvent has a low water solubility, it is possible to eliminate moisture from the substrate more precisely. Hence, because the remaining of moisture on the substrate can be suppressed or prevented, it is possible to suppress or prevent damage resulting from surface tension. Moreover, it is possible to suppress or prevent poor drying by suppressing the occurrence of a water mark.

As the fluid of the water-soluble organic solvent, a fluid of a water-soluble organic solvent that blends with deionized water at an arbitrary percentage can be used. To be more concrete, for example, methanol, ethanol, IPA (isopropyl alcohol), acetone, and Trans-1,2-dichloroethylene can be used as the fluid of the water-soluble organic solvent. As the fluid of the fluorine organic solvent, a fluid of a fluorine organic solvent that does not blend with deionized water at an arbitrary percentage can be used. To be more concrete, for example, HFE (hydrofluoroether) can be used as the fluid of the fluorine organic solvent.

Because a fluid of a water-soluble organic solvent blends with deionized water at an arbitrary percentage, a fluid of a mixed organic solvent made by mixing the fluid of the water-soluble organic solvent and a fluid of a fluorine organic solvent readily blends with moisture on the substrate. Moisture on the substrate therefore dissolves into the fluid of the mixed organic solvent and is thereby eliminated. By subsequently supplying the fluid of the fluorine organic solvent onto the substrate, the fluid of the fluorine organic solvent and the fluid of the mixed organic solvent on the substrate blend with each other, which makes it possible to eliminate even a minute trace of moisture that is dissolved into the fluid of the mixed organic solvent to the outside of the substrate.

The mixed organic solvent supplying step may include a step of supplying a liquid of a mixed organic solvent containing a liquid of the water-soluble organic solvent and a liquid of the fluorine organic solvent to the main surface of the substrate. Further, the fluorine organic solvent supplying step may include a step of supplying the liquid of the fluorine organic solvent to the main surface of the substrate.

In short, a liquid of a mixed organic solvent containing a liquid of the water-soluble organic solvent and a liquid of the fluorine organic solvent is supplied to the main surface of the substrate which has been subjected to the cleaning processing using deionized water. It is preferable to supply the liquid of the fluorine organic solvent to the main surface of the substrate after the liquid of the mixed organic solvent is supplied. Accordingly, deionized water remaining on the main surface of the substrate after the cleaning processing is eventually substituted by the liquid of the fluorine organic solvent. It is thus possible to dry the substrate satisfactorily by eliminating deionized water remaining on the main surface of the substrate after the cleaning processing completely from the main surface of the substrate.

In this case, after the liquid of the fluorine organic solvent is supplied, the substrate may be rotated about an axis interesting with the main surface using a substrate rotating unit. Accordingly, it is possible to throw off the liquid of the fluorine organic solvent from the main surface. The liquid of the fluorine organic solvent not thrown off and remaining on the main surface can evaporate due to its own volatility. The substrate can be thus dried satisfactorily.

In this case, deionized water remaining on the main surface of the substrate after the cleaning processing is substituted by the liquid of the fluorine organic solvent having a sufficient volatility. Hence, the substrate can be dried sufficiently without rotation of the substrate at high rotation speeds. It is thus possible to suppress the liquid of the fluorine organic solvent thrown off forcefully by the rotations at high rotation speeds from adhering again onto the substrate by striking upon a member on the periphery of the wafer and bouncing back to the substrate. Poor drying of the substrate and contamination of the substrate resulting from such re-adhesion can be therefore suppressed.

The fluorine organic solvent supplying step may include a step of supplying a steam of the fluorine organic solvent to the main surface of the substrate by supplying the steam of the fluorine organic solvent between the main surface of the substrate and an opposing surface that is opposed to the main surface.

In this case, a steam of the fluorine organic solvent is supplied to the main surface of the substrate after the fluid of the mixed organic solvent is supplied to the main surface. Consequently, the liquid of the mixed organic solvent can be substituted by the liquid of the fluorine organic solvent by letting the liquid of the mixed organic solvent evaporate while letting the steam of the fluorine organic solvent dissolve into the liquid of the mixed organic solvent on the main surface. It is thus possible to dry the substrate satisfactorily by eliminating deionized water from the main surface completely.

Further, by supplying the fluorine organic solvent in the form of a steam, it is possible to supply a fluorine organic solvent having a high purity and containing no moisture to the main surface of the substrate. It is thus possible to substitute the liquid of the fluorine organic solvent for the liquid of the mixed organic solvent efficiently.

Further, by supplying the steam of the fluorine organic solvent between the main surface of the substrate and the opposing surface that is opposed to the main surface, it is possible to suppress the steam of the fluorine organic solvent thus supplied from diffusing to the periphery of the substrate. Accordingly, the concentration of the steam of the fluorine organic solvent on the main surface can be maintained at high concentration. It is thus possible to supply the steam of the fluorine organic solvent efficiently to the main surface of the substrate. Further, it is possible to suppress an amount of supply of the steam of the fluorine organic solvent needed for the substitution of the liquid of the mixed organic solvent by the liquid of the fluorine organic solvent.

The mixed organic solvent supplying step may include a step of supplying a steam of a mixed organic solvent containing a steam of the water-soluble organic solvent and a steam of the fluorine organic solvent to the main surface of the substrate by supplying the steam of the mixed organic solvent between the main surface of the substrate and an opposing surface that is opposed to the main surface.

In this case, a steam of the mixed organic solvent containing a steam of the water-soluble organic solvent and a steam of the fluorine organic solvent is supplied to the main surface of the substrate to which the cleaning processing using deionized water has been applied. It is thus possible to supply a steam of the mixed organic solvent having a high purity and containing neither moisture nor impurities to the main surface of the substrate. By dissolving the steam of the mixed organic solvent into deionized water remaining on the main surface of the substrate after the cleaning processing, it is possible to substitute the liquid of the mixed organic solvent efficiently for deionized water remaining on the main surface.

Further, by supplying the steam of the mixed organic solvent between the main surface of the substrate and the opposing surface that is opposed to the main surface, it is possible to maintain the concentration of the steam of the mixed organic solvent on the main surface at high concentration. Hence, it is possible to substitute the liquid of the mixed organic solvent for deionized water remaining on the main surface of the substrate after the cleaning processing more efficiently, while it is also possible to suppress an amount of supply of the steam of the mixed organic solvent needed for the substitution of deionized water by the liquid of the mixed organic solvent.

It is preferable that the substrate processing method further includes a step of setting a temperature of the opposing surface above a dew point of the fluid of the fluorine organic solvent and setting a temperature on the main surface of the substrate to or below the dew point of the fluid of the fluorine organic solvent in parallel with the fluorine organic solvent supplying step.

By setting the temperature on the main surface of the substrate to or below the dew point of the fluid of the fluorine organic solvent, it is possible to supply a liquid of the fluorine organic solvent having a high purity and containing no moisture to the main surface by letting the steam of the fluorine organic solvent form dew condensation on the main surface. It is thus possible to dry the substrate satisfactorily by efficiently substituting the liquid of the fluorine organic solvent for the liquid of the mixed organic solvent on the main surface.

Further, by setting the temperature of the opposing surface above the dew point of the fluid of the fluorine organic solvent, it is possible to prevent the steam of the fluorine organic solvent from forming dew condensation on the opposing surface. Hence, it is possible to suppress the steam of the fluorine organic solvent from being consumed on the opposing surface. Accordingly, it is possible to supply the steam of the fluorine organic solvent efficiently to the main surface of the substrate.

It is preferable that the method further includes a step of setting a temperature of the opposing surface above a dew point of the fluid of the mixed organic solvent and setting a temperature on the main surface of the substrate to or below the dew point of the fluid of the mixed organic solvent in parallel with the mixed organic solvent supplying step.

By setting the temperature on the main surface of the substrate to or below the dew point of the fluid of the mixed organic solvent, it is possible to supply a liquid of the mixed organic solvent having a high purity and containing no moisture to the main surface by letting the steam of the mixed organic solvent form dew condensation on the main surface. It is thus possible to substitute the liquid of the mixed organic solvent having a high purity efficiently for deionized water remaining on the main surface after the cleaning processing.

Further, by setting the temperature of the opposing surface above the dew point of the mixed organic solvent, it is possible to prevent the steam of the mixed organic solvent from forming dew condensation on the opposing surface. Hence, it is possible to suppress the steam of the mixed organic solvent from being consumed on the opposing surface. Accordingly, it is possible to supply the steam of the mixed organic solvent efficiently to the main surface of the substrate.

The mixed organic solvent supplying step may include a step of heating the fluid of the mixed organic solvent to be supplied to the main surface of the substrate. By heating the fluid of the mixed organic solvent, it is possible to increase the water solubility of the fluid of the fluorine organic solvent contained in the fluid of the mixed organic solvent. Accordingly, the substitution of deionized water by the fluid of the mixed organic solvent can be enhanced. In other words, even deionized water that has gotten into the recess portions can be substituted by the liquid of the mixed organic solvent by letting the fluid of the mixed organic solvent dissolve into deionized water reliably.

The fluorine organic solvent supplying step may include a step of heating the fluid of the fluorine organic solvent to be supplied to the main surface of the substrate. By heating the fluid of the fluorine organic solvent, it is possible to enhance the volatility of the fluid of the fluorine organic solvent. It is thus possible to enhance the drying of the substrate and to shorten a drying time of the substrate.

A substrate processing apparatus of the invention includes: a substrate holding unit arranged to hold a substrate, a deionized water supply unit arranged to supply deionized water to a main surface of the substrate held by the substrate holding unit, a mixed organic solvent supply unit arranged to supply a fluid of a mixed organic solvent containing a fluid of a water-soluble organic solvent and a fluid of a fluorine organic solvent having a smaller surface tension than that of the deionized water and a lower water solubility than that of the fluid of the water-soluble organic solvent to the main surface of the substrate held by the substrate holding unit, a fluorine organic solvent supply unit arranged to supply the fluid of the fluorine organic solvent to the main surface of the substrate held by the substrate holding unit, and a control unit arranged to execute a cleaning processing step of cleaning the main surface with the deionized water by supplying the deionized water to the main surface of the substrate by controlling the deionized water supply unit, a mixed organic solvent supplying step of supplying the fluid of the mixed organic solvent to the main surface of the substrate by controlling the mixed organic solvent supply unit after the cleaning processing step, and a fluorine organic solvent supplying step of supplying the fluid of the fluorine organic solvent to the main surface of the substrate by controlling the fluorine organic solvent supply unit after the mixed organic solvents supplying step.

The above and other objects, features, and advantages of the invention will become more apparent from the following description of embodiments with reference to the accompanying drawings.

BRIEF DESCRIPTION OF THE DRAWINGS

FIG. 6($a$) and FIG. 6($b$) are views describing processed states of the wafer during the processing in FIG. 5;

DETAILED DESCRIPTION OF THE PREFERRED EMBODIMENTS

Figure 1:
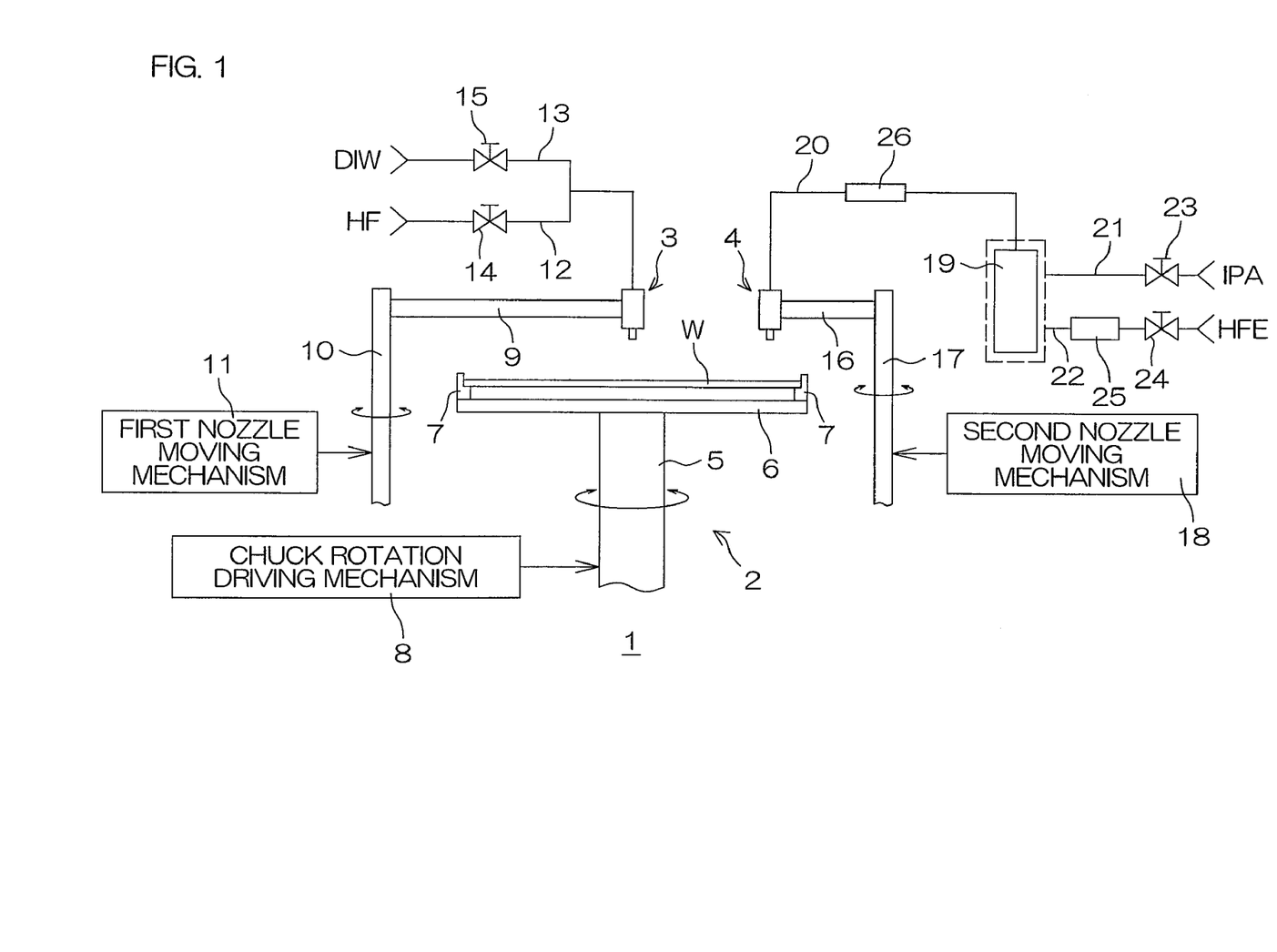
FIG. 1 is a schematic view describing the configuration of a substrate processing apparatus according to a first embodiment of the invention.

FIG. 1 is a schematic view describing the configuration of a substrate processing apparatus 1 according to a first embodiment of the invention. The substrate processing apparatus 1 is a single substrate processing apparatus that applies processing using a processing solution (chemical, cleaning solution, or organic solvent) to a semiconductor wafer W (hereinafter, referred to simply as the wafer W) as an example of the substrate. The substrate processing apparatus 1 includes a spin chuck 2 (substrate holding unit, substrate rotating unit) that rotates the wafer W while holing it in an almost horizontal posture, a first nozzle 3 that supplies a chemical or a cleaning solution to the surface (top surface) of the wafer W held by the spin chuck 2, and a second nozzle 4 that supplies an organic solvent to the surface of the wafer W held by the spin chuck 2.

The spin chuck 2 has a rotation shaft 5 extending in a vertical direction and a disk-shaped spin base 6 attached to the top end of the rotation shaft 5 in a horizontal posture. The spin chuck 2 is able to hold the wafer W in an almost horizontal posture using plural chuck pins 7 provided so as to stand along the rim of the top surface of the spin base 6. In other words, the plural spin chucks 7 are disposed at suitable intervals on the circumference corresponding to the shape of the outer periphery of the wafer W along the rim of the top surface of the spin base 6. The plural chuck pins 7 pinch the wafer W in cooperation by supporting the peripheral portion of the back surface (bottom surface) of the wafer W while abutting on the peripheral surface of the wafer W at different positions, and are thereby able to hold the wafer W in an almost horizontal posture.

A chuck rotation driving mechanism 8 including a driving source, such as a motor, is coupled to the rotation shaft 5. By inputting a driving force from the chuck rotation driving mechanism 8 to the rotation shaft 5 while the wafer W is held by the plural chuck pins 7, it is possible to rotate the wafer W about the axis that is vertical and passes through the center of the surface of the wafer W.

The spin chuck 2 is not limited to the configuration as described above. For example, it is possible to adopt a vacuum suction type (vacuum chuck) configured to rotate a wafer W by rotating about the vertical axis while holding the wafer W in an almost horizontal posture by means of vacuum suction to the back surface of the wafer W.

The first nozzle 3 is, for example, a straight nozzle that discharges a continuum flow of a chemical or a cleaning solution, and it is attached to the tip end of an arm 9 extending almost horizontally with its discharge port facing toward the wafer W (downward). The arm 9 is supported on a supporting shaft 10 that extends almost vertically, and extends from the top end portion of the supporting shaft 10 almost horizontally.

The supporting shaft 10 is configured to be rotatable about the center axis, to which a first nozzle moving mechanism 11 is coupled that moves the first nozzle 3 almost horizontally by rotating the supporting shaft 10. By moving the first nozzle 3 almost horizontally by the first nozzle moving mechanism 11, it is possible to locate the first nozzle 3 above the wafer W held by the spin chuck 2 and to evacuate the first nozzle 3 from above the wafer W.

A hydrofluoric acid supply tube 12 and a first DIW supply tube 13 (deionized water supply unit) are connected to the first nozzle 3. Hydrofluoric acid as a chemical is supplied to the first nozzle 3 from the hydrofluoric acid supply tube 12 while DIW (deionized water) as a cleaning solution is supplied to the first nozzle 3 from the first DIW supply tube 13. A hydrofluoric acid valve 14 is interposed in the hydrofluoric acid supply tube 12, and it is possible to control a supply of hydrofluoric acid to the first nozzle 3 by opening and closing the hydrofluoric acid valve 14. A first DIW valve 15 is interposed in the first DIW supply tube 13, and it is possible to control a supply of DIW to the first nozzle 3 by opening and closing the first DIW valve 15. By opening either one of the hydrofluoric acid valve 14 and the first DIW valve 15, it is possible to supply hydrofluoric acid or DIW selectively to the first nozzle 3.

The second nozzle 4 is, for example, a straight nozzle that discharges a continuum flow of an organic solvent (liquid), and is attached to the tip end of an arm 16 extending almost horizontally with its discharge port facing toward the wafer W (downward). The arm 16 is supported on a supporting shaft 17 extending almost vertically and extends from the top end of the supporting shaft 17 almost horizontally.

The supporting shaft 17 is provided so as to be rotatable about the center axis, to which a second nozzle moving mechanism 18 is coupled that moves the second nozzle 4 almost horizontally by rotating the supporting shaft 17. By moving the second nozzle 4 almost horizontally by the second nozzle moving mechanism 18, it is possible to locate the second nozzle 4 above the wafer W held by the spin chuck 2 and to evacuate the second nozzle 4 from above the wafer W.

An organic solvent is supplied to the second nozzle 4 from a processing solution supply tube 20 via a manifold 19. An IPA supply tube 21 (mixed organic solvent supply unit) and an HFE supply tube 22 (fluorine organic solvent supply unit, mixed organic solvent supply unit) are connected to the manifold 19. IPA (liquid) as a fluid of a water-soluble organic solvent is supplied to the manifold 19 from the IPA supply tube 21 and HFE (liquid) as a fluid of a fluorine organic solvent is supplied to the manifold 19 from the HFE supply tube 22.

IPA is a liquid of a water-soluble organic solvent having higher volatility and smaller surface tension than DIW, and can blend with DIW at an arbitrary percentage. HFE is a liquid of a fluorine organic solvent having higher volatility and smaller surface tension than IPA and DIW, and cannot blend with DIW at an arbitrary percentage. As HFE, for example, HFE available from Sumitomo 3M Ltd. under the product name of Novec (registered trademark) series can be used. To be more concrete, for example, Novec 7100/7100DL (chemical formula: $C_4F_9OCH_3$), Novec 7200 (chemical formula: $C_4F_9OC_2H_5$), Novec 7300 (chemical formula: $C_6F_{13}OCH_3$), and or the like can be used as HFE. Regarding the surface tension of the respective organic solvents, Novec 7100/7100DL has 13.6 mN/m, Novec 7200 has 13.6 mN/m, and Novec 7300 has 15 mN/m. It is therefore understood that all of these organic solvents have surface tension smaller than the surface tension of deionized water (76 mN/m).

An opening-adjustable IPA valve 23 is interposed in the IPA supply tube 21. It is possible to control a supply of IPA to the manifold 19 by opening and closing the IPA valve 23. Likewise, an opening-adjustable HFE valve 24 is interposed in the HFE supply tube 22. It is possible to control a supply of HFE to the manifold 19 by opening and closing the HFE valve 24. By opening either one or both of the IPA valve 23 and the HFE valve 24, it is possible to selectively supply one or both of IPA and HFE to the manifold 19.

By adjusting the opening of the IPA valve 23, it is possible to control an amount of supply of IPA to be supplied to the manifold 19. By adjusting the opening of the HFE valve 24, it is possible to control an amount of supply of HFE to be supplied to the manifold 19. In a case where both of IPA and HFE are supplied to the manifold 19, the opening of each of the IPA valve 23 and the HFE valve 24 is adjusted. For example, IPA and HFE account for 5% and 95%, respectively, of a total volume of IPA and HFE to be supplied simultaneously to the manifold 19.

A heater 25 is interposed in the HFE supply tube 22, and HFE circulating through the HFE supply tube 22 is heated to a predetermined temperature (a temperature lower than the boiling point of HFE) by the heater 25. Hence, heated HFE is supplied to the manifold 19.

When IPA and HFE are supplied to the manifold 19, supplied IPA and HFE are mixed with each other in the manifold 19 to form a mixed organic solvent (liquid), then supplied to the processing solution supply tube 20 in the form of a mixed organic solvent. Because HFE supplied to the manifold 19 is heated by the heater 25, a heated organic solvent is supplied to the processing solution supply tube 20. The mixed organic solvent supplied to the processing solution supply tube 20 is stirred in a circulation tube 26 with stirring fin interposed somewhere in midstream of the processing solution supply tube 20. As has been described, the mixed organic solvent sufficiently mixing IPA and HFE is supplied to the second nozzle 4.

The circulation tube 26 with stirring fin has a configuration in which plural stirring fins formed of rectangular plate-like bodies twisted by 180° about the axis set on the fluid circulation direction are aligned inside a tube member along the tube axis in postures such that each has a rotation angle about the tube center axis along the fluid circulation direction shifted by 90°. For example, a product available from Noritake Co., Ltd. and Advance Electric Co., Inc. under the product name of "MX series: INLINE MIXER" can be used as the circulation tube 26 with stirring fin.

Figure 2:
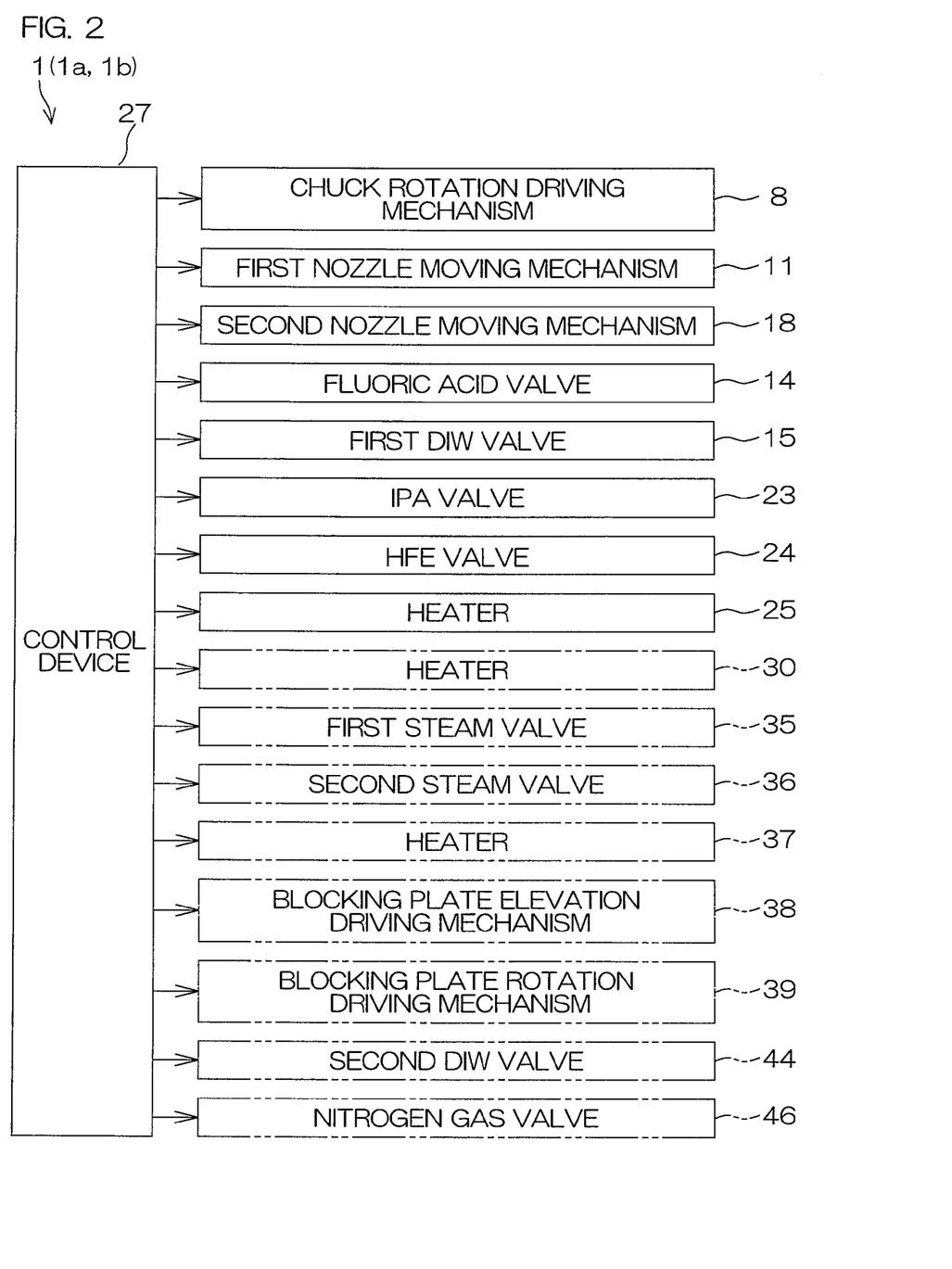
FIG. 2 is a block diagram describing the electrical configuration of the substrate processing apparatus.

FIG. 2 is a block diagram describing the electrical configuration of the substrate processing apparatus 1. The substrate processing apparatus 1 includes a control device 27. The control device 27 controls operations of the chuck rotation driving mechanism 8, the first nozzle moving mechanism 11, and the second nozzle moving mechanism 18. The control device 27 also controls the opening and closing operations of the fluoric acid valve 14, the first DIW valve 15, the IPA valve 23, and the HFE valve 24. Further, the control device 27 controls the switching on/off operations of the heater 25 and a heating temperature by the heater 25.

Figure 3:
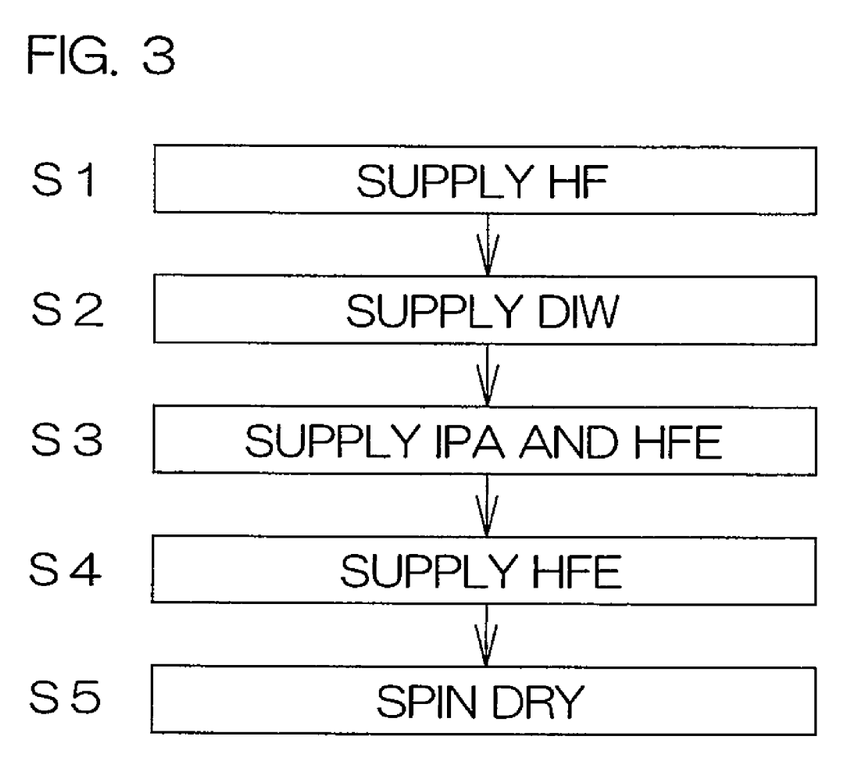
FIG. 3 is a flowchart showing an example of the processing applied to a wafer by the substrate processing apparatus of the first embodiment.

FIG. 3 is a flowchart showing an example of the processing applied to the wafer W by the substrate processing apparatus 1 of the first embodiment. Hereinafter, references will be made to FIG. 1 through FIG. 3.

A wafer W subjected to processing is transported by a delivery robot not shown and delivered to the spin chuck 2 from the delivery robot. When the wafer W is delivered to the spin chuck 2, the control device 27 controls the chuck rotation driving mechanism 8 to rotate the wafer W held by the spin chuck 2 at a predetermined solution processing rotation speed. Further, the control device 27 controls the first nozzle moving mechanism 11 to locate the first nozzle 3 above the wafer W held by the spin chuck 2.

Subsequently, the control device 27 opens the fluoric acid valve 14 to supply fluoric acid toward the vicinity of the rotation center on the surface of the wafer W from the first nozzle 3 (Step S1). Fluoric acid supplied to the surface of the wafer W undergoes a centrifugal force induced by rotations of the wafer W and spreads across the entire surface of the wafer W instantaneously. The chemical processing using fluoric acid is thus applied across the entire surface of the wafer W.

When a supply of fluoric acid is continued over a predetermined chemical processing time, the control device 27 closes the fluoric acid valve 14 to stop the supply of fluoric acid from the first nozzle 3, and opens the first DIW valve 15 to supply DIW toward the vicinity of the rotation center on the surface of the wafer W from the first nozzle 3 (Step S2). DIW supplied to the surface of the wafer W undergoes a centrifugal force induced by rotations of the wafer W and spreads across the entire surface of the wafer W instantaneously. Accordingly, fluoric acid remaining on the surface of the wafer W is cleaning away. In short, cleaning processing using DIW is applied across the entire surface of the wafer W.

When a supply of DIW has continued over a predetermined cleaning processing time, the control device 27 closes the first DIW valve 15 to stop the supply of DIW from the first nozzle 3, and controls the first nozzle moving mechanism 11 to evacuate the first nozzle 3 from above the wafer W. Subsequently, the control device 27 controls the second nozzle moving mechanism 18 to locate the second nozzle 4 above the wafer W held by the spin chuck 2. The control device 27 then opens the IPA valve 23 and the HFE valve 24 to supply IPA and HFE to the manifold 19.

IPA and HFE supplied to the manifold 19 are mixed with each other in the manifold 19 to form a mixed organic solvent. IPA and HFE are thus supplied to the processing solution supply tube 20 in the form of a mixed organic solvent. The mixed organic solvent supplied to the processing solution supply tube 20 is stirred in the circulation tube 26 with stirring fin, after which it is supplied toward the vicinity of the rotation center on the surface of the wafer W from the second nozzle 4 (Step S3). The mixed organic solvent supplied to the surface of the wafer W undergoes a centrifugal force induced by rotations of the wafer W and spreads across the entire surface of the wafer W instantaneously. Consequently, DIW remaining on the surface of the wafer W after the cleaning processing is substituted by the mixed organic solvent.

To be more concrete, DIW remaining on the surface of the wafer W after the cleaning processing is washed away by the mixed organic solvent supplied to the surface of the wafer W while it dissolves into the mixed organic solvent to be eventually substituted by the mixed organic solvent.

Because the mixed organic solvent contains IPA, which is a water-soluble organic solvent, DIW remaining on the surface of the wafer W after the cleaning processing dissolves into IPA contained in the mixed organic solvent satisfactorily. In other words, not only DIW on the surface of the wafer W, but also DIW that got into recess portions or holes in a pattern formed on the surface dissolves into IPA. Further, HFE contained in the mixed organic solvent blends with IPA in which DIW is dissolved. In short, DIW remaining on the surface of the wafer W after the cleaning processing dissolves into the mixed organic solvent homogeneously. Further, because the mixed organic solvent supplied to the surface of the wafer W is heated, solubility of IPA and HFE contained in the mixed organic solvent is enhanced. Hence, DIW can dissolve not only into IPA but also into HFE directly. The substitutability of DIW by the mixed organic solvent can be thus enhanced.

When a supply of the mixed organic solvent is continued over a predetermined processing time, the control device 27 closes the IPA valve 23 to stop the supply of IPA to the manifold 19. Accordingly, HFE alone is supplied to the manifold 19, which allows HFE alone to be discharged from the second nozzle 4. HFE discharged from the second nozzle 4 is supplied to the vicinity of the rotation center on the surface of the wafer W, and spreads across the entire surface of the wafer W instantaneously since it undergoes a centrifugal force induced by rotations of the wafer W (Step S4). The mixed organic solvent on the surface of the wafer W is thus substituted by HFE. More predeterminedally, the mixed organic solvent on the surface of the wafer W is washed away by HFE supplied to the surface of the wafer W while it dissolves into HFE to be eventually substituted by HFE.

When a supply of HFE is continued over a predetermined processing time, the control device 27 closes the HFE valve 24 to stop the supply of HFE from the second nozzle 4, and controls the second nozzle moving mechanism 18 to evacuate the second nozzle 4 from above the wafer W. The control device 27 then controls the chuck rotation driving mechanism 8 to change the rotation speed of the wafer W held by the spin chuck 2 to a predetermined low rotation speed (for example, 300 to 1500 rpm) faster than the liquid processing rotation speed. Accordingly, HFE on the surface of the wafer W undergoes a centrifugal force induced by rotations of the wafer W to be thrown off to the periphery of the wafer W. HFE that is not thrown off and remaining on the surface evaporates due to its own volatility. The surface of the wafer W is thus dried (Step S5; spin dry processing).

In this instance, because the rotation speed of the wafer W is set to the low rotation speed, it is possible to suppress HFE on the surface of the wafer W from being thrown off forcefully to the periphery of the wafer W. This suppresses HFE that is thrown off from striking upon a member on the periphery of the wafer W and bouncing back to the surface of the wafer W to adhere thereon again. It is thus possible to suppress poor drying or contamination of the wafer W caused by re-adhesion. In addition, because HFE having sufficient volatility alone is present on the surface of the wafer W, it is possible to dry the wafer W in a short time satisfactorily.

When the spin dry processing is continued over a predetermined spin dry processing time, the control device 27 controls the chuck control driving mechanism 8 to stop rotations of the wafer W. The processed wafer W is then transported from the spin chuck 2 by the delivery robot, though not shown.

As has been described, according to the first embodiment, supplying the mixed organic solvent (liquid) containing IPA (liquid) as a fluid of a water-soluble organic solvent and HFE (liquid) as a fluid of a fluorine organic solvent to the surface of the wafer W after the cleaning processing allows DIW remaining on the surface of the wafer W after the cleaning processing to dissolve into HFE contained in the mixed organic solvent via IPA contained in the mixed organic solvent. It is thus possible to substitute the mixed organic solvent for DIW remaining on the surface of the wafer W after the cleaning processing. By supplying HFE alone to the surface of the wafer W after the mixed organic solvent is supplied to the surface, it is possible to eliminate DIW completely from the surface of the wafer W by substituting HFE for the mixed organic solvent. Accordingly, because it is possible to suppress DIW from being left on the surface of the wafer W, it is possible to suppress the occurrence of damage, such as a pattern collapse, or poor drying, such as a water mark on the surface of the wafer W.

Figure 4:
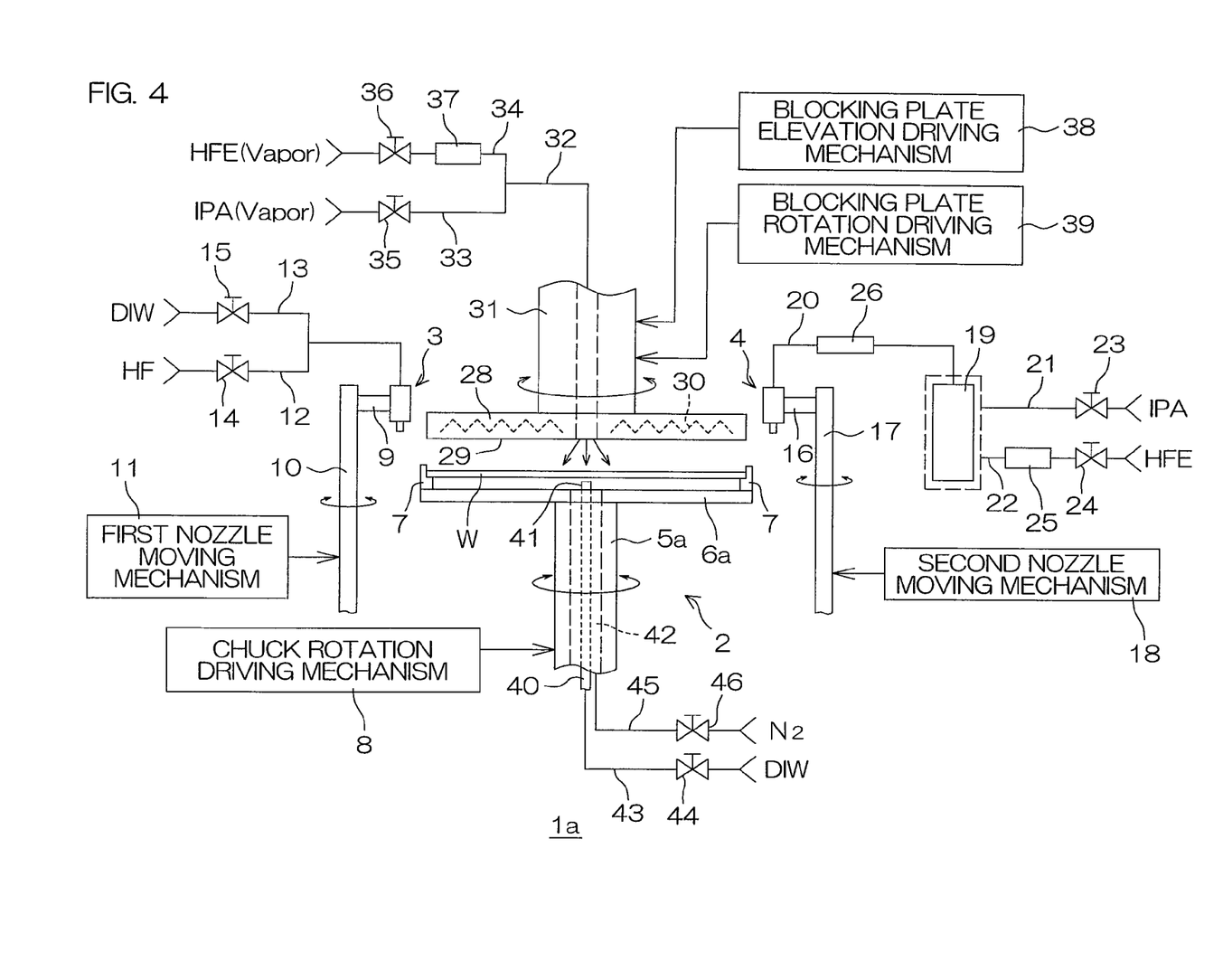
FIG. 4 is a schematic view describing the configuration of a substrate processing apparatus according to a second embodiment of the invention.

FIG. 4 is a schematic view describing the configuration of a substrate processing apparatus 1a according to a second embodiment of the invention. In FIG. 4, portions corresponding to the respective portions shown in FIG. 1 are labeled with the same reference numerals as those of the corresponding portions. Hereinafter, detailed descriptions of the respective portions labeled with the same reference numerals are omitted.

A major difference between the configuration of the substrate processing apparatus 1a of FIG. 4 and the configuration of the substrate processing apparatus 1 of FIG. 1 is that a blocking plate 28 is provided above the spin chuck 2. To be more concrete, the blocking plate 28 is a member in the shape of a circular plate having substantially the same diameter as the wafer W (or a diameter slightly larger than that of the wafer W) and is located above the spin chuck 2 in an almost horizontal posture. The bottom surface of the blocking plate 28 is an opposing surface 29 that opposes the surface of the wafer W held by the spin chuck 2 and has an opening at the center thereof. The opening communicates with a through-hole that penetrates through the blocking plate 28. In addition, because the blocking plate 28 has a heater 30 inside, the entire blocking plate 28 can be heated to a predetermined temperature by the heater 30. It is thus possible to heat the opposing surface 29 entirely to a predetermined temperature.

Further, a cylindrical supporting shaft 31, which is located on the axis common with the rotation shaft 5, is linked to the top surface of the blocking plate 28. The supporting shaft 31 is a hollow shaft and the internal space thereof communicates with the through-hole. A steam supply tube 32 that supplies a steam of an organic solvent to the surface of the wafer W is connected to the internal space of the supporting shaft 31. In addition, an IPA steam supply tube 33 (mixed organic solvent supply unit) and an HFE steam supply tube 34 (fluorine organic solvent supply unit) are connected to the steam supply tube 32. An IPA vapor as a fluid of a water-soluble organic solvent is supplied to the steam supply tube 32 from the IPA steam supply tube 33, and an HFE vapor as a fluid of a fluorine organic solvent is supplied to the steam supply tube 32 from the HFE steam supply tube 34.

The IPA vapor or the HFE vapor supplied to the steam supply tube 32 is discharged toward the surface of the wafer W from the opening formed in the opposing surface 29 by passing through the internal space of the supporting shaft 31 and the through-hole. In addition, when both of the IPA vapor and the HFE vapor are supplied to the steam supply tube 32, the IPA vapor and the HFE vapor mix with each other in the steam supply tube 32 to form a steam of the mixed organic solvent. The IPA vapor and the HFE vapor are thus discharged toward the surface of the wafer W from the opening in the opposing surface 29 in the form of a steam of the mixed organic solvent.

An opening-adjustable first steam valve 35 is interposed in the IPA steam supply tube 33, and it is possible to control a supply of the IPA vapor to the steam supply tube 32 by opening and closing the first steam valve 35. In addition, an opening-adjustable second steam valve 36 is interposed in the HFE steam supply tube 34, and it is possible to control a supply of the HFE vapor to the steam supply tube 32 by opening and closing the second steam valve 36 (b)y opening either one or both of the first and second steam valves 35 and 36, it is possible to selectively supply either one or both of the IPA vapor and HFE vapor to the steam supply tube 32.

Further, it is possible to control an amount of supply of the IPA vapor to be supplied to the steam supply tube 32 by adjusting the opening of the first steam valve 35, and it is possible to control an amount of supply of the HFE vapor to be supplied to the steam supply tube 32 by adjusting the opening of the second steam valve 36. In a case where both of the IPA vapor and the HFE vapor are supplied to the steam supply tube 32, the opening of each of the first steam valve 35 and the second steam valve 36 is adjusted, so that, for example, the IPA vapor accounts for 5 to 50% of a total volume of the IPA vapor and the HFE vapor to be supplied simultaneously to the steam supply tube 32.

A heater 37 is interposed in the HFE steam supply tube 34, and the HFE vapor circulating through the HFE steam supply tube 34 is heated to a predetermined temperature by the heater 37. Hence, the heated HFE vapor is supplied to the steam supply tube 32 and the heated HFE vapor is discharged from the opening in the opposing surface 29. In a case where both of the IPA vapor and the HFE vapor are supplied to the steam supply tube 32, a steam of the heated mixed organic solvent is discharged from the opening in the opposing surface 29.

A blocking plate elevation driving mechanism 38 and a blocking plate rotation driving mechanism 39 are coupled to the supporting shaft 31. By moving up or down the supporting shaft 31 and the blocking plate 28 by the blocking plate elevation driving mechanism 38, it is possible to move up or down the blocking plate 28 between a proximity position (the position shown in FIG. 4) in close proximity to the surface of the wafer W held by the spin chuck 2 and an evacuation position evacuated far above the spin chuck 2. The blocking plate rotation driving mechanism 39 is mainly used to rotate the blocking plate 28 during the cleaning by supplying a blocking plate cleaning solution, such as deionized water, to the top surface or the bottom surface of the blocking plate 28, and is adapted to hold the blocking plate 28 in a non-rotating state while the processing, such as cleaning processing or dry processing, is applied to the wafer W. However, when the need arises, the blocking plate 28 may be rotated almost synchronized with rotations of the wafer W by the spin chuck 2 (or at a slightly different rotation speed) while the processing is applied to the wafer W, for example, while the cleaning processing or the dry processing is applied to the wafer W.

In addition, an opening is formed at the center of the top surface of the spin base 6a, and a rotation shaft 5a is adapted into a hollow shaft. The internal space of the rotation shaft 5a and the opening formed in the top surface of the spin base 6a communicate with each other via a through-hole penetrating through the spin base 6a. Further, a tube member 40 is inserted through the internal space of the rotation shaft 5a in a non-contact state with the rotation shaft 5a, and the internal space of the tube member 40 defines a DIW channel through which DIW circulates. The tip end of the tube member 40 forms a lower nozzle 41 that extends to a position in close proximity to the center of the back surface of the wafer W held by the spin chuck 2, and the tip end is formed with a DIW discharge port for discharging DIW toward the center of the back surface of the wafer W.

A cylindrical space between the tube member 40 and the inner peripheral surface of the rotation shaft 5a defines a nitrogen gas channel 42 through which a nitrogen gas circulates. The nitrogen gas channel 42 communicates with the through-hole formed in the spin base 6a, and a space between the lower nozzle 41 and the opening formed in the top surface serves as a nitrogen gas discharge port for discharging a nitrogen gas.

A second DIW supply tube 43 is connected to the DIW channel, and DIW is supplied from the second DIW supply tube 43. A second DIW valve 44 is interposed in the second DIW supply tube 43, and it is possible to control a supply of DIW to the DIW channel by opening and closing the second DIW valve 44. DIW supplied to the DIW channel is discharged toward the back surface of the wafer W held by the spin chuck 2 from the lower nozzle 41.

In addition, a nitrogen gas supply tube 45 is connected to the nitrogen gas channel 42, and a nitrogen gas is supplied from the nitrogen gas supply tube 45. A nitrogen gas valve 46 is interposed in the nitrogen gas supply tube 45, and it is possible to control a supply of a nitrogen gas to the nitrogen gas channel 42 by opening and closing the nitrogen gas valve 46. A nitrogen gas supplied to the nitrogen gas channel 42 is discharged toward the back surface of the wafer W held by the spin chuck 2 from the nitrogen gas discharge port.

As is indicated by a chain double-dashed line in FIG. 2, operations of the blocking plate elevation driving mechanism 38 and the blocking plate rotation driving mechanism 39 are controlled by the control device 27. The opening and closing operations of the first steam valve 35, the second steam valve 36, the second DIW valve 44, and the nitrogen gas valve 46 are controlled by the control device 27. The switching on/off operations of the heaters 30 and 37 and heating temperatures by the heaters 30 and 37 are controlled by the control device 27.

Figure 5:
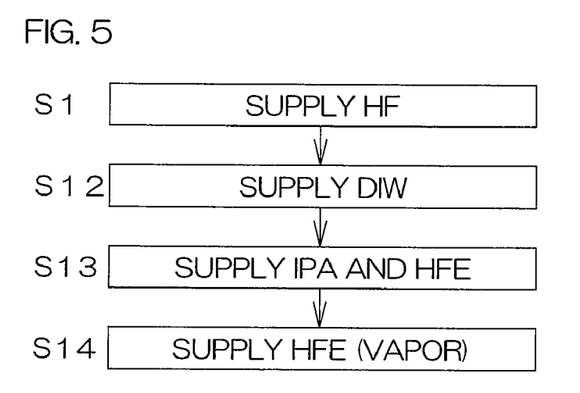
FIG. 5 is a flowchart showing an example of the processing applied to a wafer by the substrate processing apparatus of the second embodiment.
Figure 6:
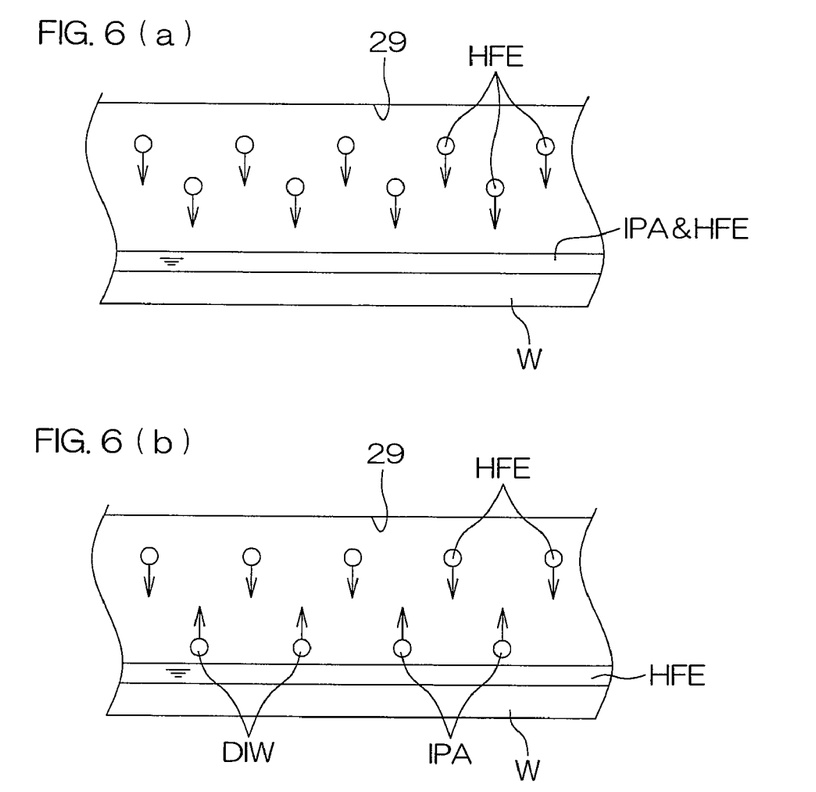

FIG. 5 is a flowchart showing an example of the processing applied on the wafer W by the substrate processing apparatus 1a of the second embodiment. FIG. 6(a) and FIG. 6(b) are views describing processed states of the wafer W. In FIG. 5 and FIGS. 6(a) and 6(b), steps and portions corresponding to the respective portions shown in FIG. 1 and FIG. 3 are labeled with the same reference numerals as those of the corresponding portions. Hereinafter, detailed descriptions of the respective portions labeled with the same reference numerals are omitted.

A wafer W subjected to processing is transported by a delivery robot not shown and delivered to the spin chuck 2 from the delivery robot. In this instance, the blocking plate 28 is located at the evacuation position evacuated far above the spin chuck 2 by the blocking plate elevation driving mechanism 38.

When the wafer W is delivered to the spin chuck 2, the control device 27 controls the chuck rotation driving mechanism 8 to rotate the wafer W held by the spin chuck 2 at a predetermined rotation speed. The control device 27 also controls the first nozzle moving mechanism 11 to locate the first nozzle 3 above the wafer W held by the spin chuck 2.

Subsequently, the control device 27 opens the fluoric acid valve 14 to supply fluoric acid toward the vicinity of the rotation center on the surface of the wafer W from the first nozzle 3 (Step S1). Fluoric acid supplied to the surface of the wafer W undergoes a centrifugal force induced by the rotations of the wafer W and spreads across the entire surface of the wafer W instantaneously. Chemical processing using fluoric acid is thus applied across the entire surface of the wafer W.

When a supply of fluoric acid is continued over a predetermined chemical processing time, the control device 27 closes the fluoric acid valve 14 to stop the supply of fluoric acid from the first nozzle 3, and opens the first DIW valve 15 to supply DIW toward the vicinity of the rotation center on the surface of the wafer W from the first nozzle 3. DIW supplied to the surface of the wafer W undergoes a centrifugal force induced by rotations of the wafer W and spreads across the entire surface of the wafer W instantaneously.

Meanwhile, the control device 27 opens the second DIW valve 44 to supply DIW toward the vicinity of the rotation center on the back surface of the wafer W from the lower nozzle 41 while continuing the supply of DIW to the surface of the wafer W from the first nozzle 3 (Step S12). DIW supplied to the back surface of the wafer W undergoes a centrifugal force induced by rotations of the wafer W and spreads across the entire back surface of the wafer W instantaneously. Accordingly, fluoric acid remaining not only on the surface of the wafer W but also on the back surface of the wafer W is washed away. In short, the cleaning processing using DIW is applied across both the surface and the back surface of the wafer W.

When a supply of DIW is continued over a predetermined cleaning processing time, the control device 27 closes the first DIW valve 15 to stop the supply of DIW from the first nozzle 3, and closes the second DIW valve 44 to stop the supply of DIW from the lower nozzle 41. Subsequently, the control device 27 controls the first nozzle moving mechanism 11 to evacuate the first nozzle 3 from above the wafer W, and controls the second nozzle moving mechanism 18 to locate the second nozzle 4 above the wafer W held by the spin chuck 2.

Subsequently, the control device 27 opens the IPA valve 23 and the HFE valve 24 to supply IPA (liquid) and HFE (liquid) to the manifold 19. IPA and HFE supplied to the manifold 19 are mixed with each other in the manifold 19 to form a mixed organic solvent (liquid) and are thus supplied to the processing solution supply tube 20 in the form of a mixed organic solvent. The mixed organic solvent supplied to the processing solution supply tube 20 is stirred in the circulation tube 26 with stirring fin, and then supplied toward the vicinity of the rotation center on the surface of the wafer W from the second nozzle 4 (Step S13). The mixed organic solvent supplied to the surface of the wafer W undergoes a centrifugal force induced by rotations of the wafer W and spreads across the entire surface of the wafer W instantaneously. DIW remaining on the surface of the wafer W after the cleaning processing is thus substituted by the mixed organic solvent.

When a supply of the mixed organic solvent is continued over a predetermined processing time, the control device 27 closes the IPA valve 23 and the HFE valve 24 to stop the supplies of IPA and HFE to the manifold 19. Subsequently, the control device 27 controls the second nozzle moving mechanism 18 to evacuate the second nozzle 4 from above the wafer W.

The control device 27 then controls the blocking plate elevation driving mechanism 38 to move down the blocking plate 28. The opposing surface 29 of the blocking plate 28 is thus located at a position in close proximity to the surface of the wafer W held by the spin chuck 2.

Subsequently, the control device 27 opens the second steam valve 36 to supply the HFE vapor to the steam supply tube 32 from the HFE steam supply tube 34. The HFE vapor supplied to the steam supply tube 32 is discharged toward the vicinity of the rotation center on the surface of the wafer W from the opening in the opposing surface 29 by passing through the internal space of the supporting shaft 31. The HFE vapor thus discharged spreads toward the rim of the wafer W between the surface of the wafer W and the opposing surface 29. A space between the surface of wafer W and the opposing surface 29 is therefore filled with the HFE vapor, and the HFE vapor is supplied across the entire surface of the wafer W (Step S14).

In this instance, the control device 27 controls the heater 30 to heat the blocking plate 28 to a predetermined temperature. To be more concrete, the temperature of the opposing surface 29 is raised to a temperature higher than the dewpoint of HFE by heating the blocking plate 28. In addition, the control device 27 opens the nitrogen gas valve 46 to discharge a nitrogen gas toward the vicinity of the rotation center on the back surface of the wafer W from the nitrogen gas discharge port. The nitrogen gas thus discharged spreads toward the rim of the wafer W between the back surface of the wafer W and the top surface of the spin base 6a. A space between the back surface of the wafer W and the top surface of the spin base 6a is therefore filled with the nitrogen gas, and the nitrogen gas is supplied across the entire back surface of the wafer W. The wafer W to which is supplied the nitrogen gas is cooled by the supply of the nitrogen gas and rotations of the wafer W by the spin chuck 2. The control device 27 controls an amount of supply of the nitrogen gas and the rotation speed of the wafer W so that the temperature on the surface of the wafer W stays at or below the dew point of HFE.

Because the temperature on the surface of the wafer W is set to or below the dew point of HFE, the HFE vapor supplied to the surface of the wafer W forms dew condensation on the surface of the wafer W as is shown in FIG. 6(a) and is thereby supplied to the surface of the wafer W as a liquid of HFE having a high purity and containing no moisture. In other words, even an organic solvent having low water solubility like HFE, a liquid of HFE contains an extremely minute trace of moisture. Hence, when a liquid of HFE is supplied to the surface of the wafer W, such a minute trace of moisture contained in HFE is also supplied to the surface of the wafer W. In contrast, the HFE vapor is obtained by evaporating HFE alone from a liquid of HFE and therefore contains no moisture. A liquid of HFE obtained by condensing the HFE vapor therefore contains no moisture and attains a high purity.

By continuing the supply of the HFE vapor and the liquid of HFE to the surface of the wafer W, the concentration of HFE in the mixed organic solvent (liquid) on the surface of the wafer W increases and, as is shown in FIG. 6(b), DIW dissolved in IPA contained in the mixed organic solvent and the mixed organic solvent evaporates. Hence, the mixed organic solvent on the surface of the wafer W is eventually substituted by the liquid of HFE. DIW remaining on the surface of the wafer W after the cleaning processing is thus removed completely from the surface of the wafer W.

In this instance, because the temperature of the opposing surface 29 is set to a temperature higher than the dew point of HFE, it is possible to suppress the HFE vapor present between the surface of the wafer W and the opposing surface 29 from being consumed by dew condensation on the opposing surface 29. It is thus possible to supply the HFE vapor efficiently to the surface of the wafer W. Further, because the opposing surface 29 of the blocking plate 28 is brought into close proximity to the surface of the wafer W, it is possible to suppress the HFE vapor from diffusing above the wafer W. The concentration of the HFE vapor in the space between the surface of the wafer W and the opposing surface 29 is therefore maintained at high concentration. It is thus possible to supply the HFE vapor efficiently to the surface of the wafer W.

By continuing the supply of the HFE vapor to the surface of the wafer W, as has been described, the mixed organic solvent on the surface of the wafer W is substituted by the liquid of HFE. After the mixed organic solvent is substituted by the liquid of HFE, the liquid of HFE on the surface of the wafer W evaporates due to heat energy of the HFE vapor subsequently supplied and the volatility of HFE, and the wafer W is dried. In this instance, because the HFE vapor is heated by the heater 37, the volatility thereof is increased. It is therefore possible to dry the wafer W in a shorter time satisfactorily.

When the wafer W is dried by continuing the supply of the HFE vapor over a predetermined processing time, the control device 27 closes the second steam valve 36 to stop the supply of the HFE vapor to the surface of the wafer W. Subsequently, the control device 27 controls the blocking plate elevation driving mechanism 38 to evacuate the blocking plate 28 far above from the spin chuck 2. Further, the control device 27 closes the nitrogen gas valve 46 to stop the supply of the nitrogen gas to the back surface of the wafer W, and controls the chuck rotation driving mechanism 8 to stop rotations of the wafer W. The processed wafer W is then transported from the spin chuck 2 by the delivery robot not shown.

By drying the wafer W while rotating the wafer W in a state where the top surface of the wafer W is brought into close proximity to the blocking plate 28 when the dry processing is applied to the wafer W as described above, it is possible to dry the bottom surface of the wafer W as well. In this case, the blocking plate 28 in close proximity to the top surface of the wafer W prevents droplets on the bottom surface of the wafer W blown off by a centrifugal force induced by rotations of the wafer W from adhering onto the top surface of the wafer W.

Figure 7:
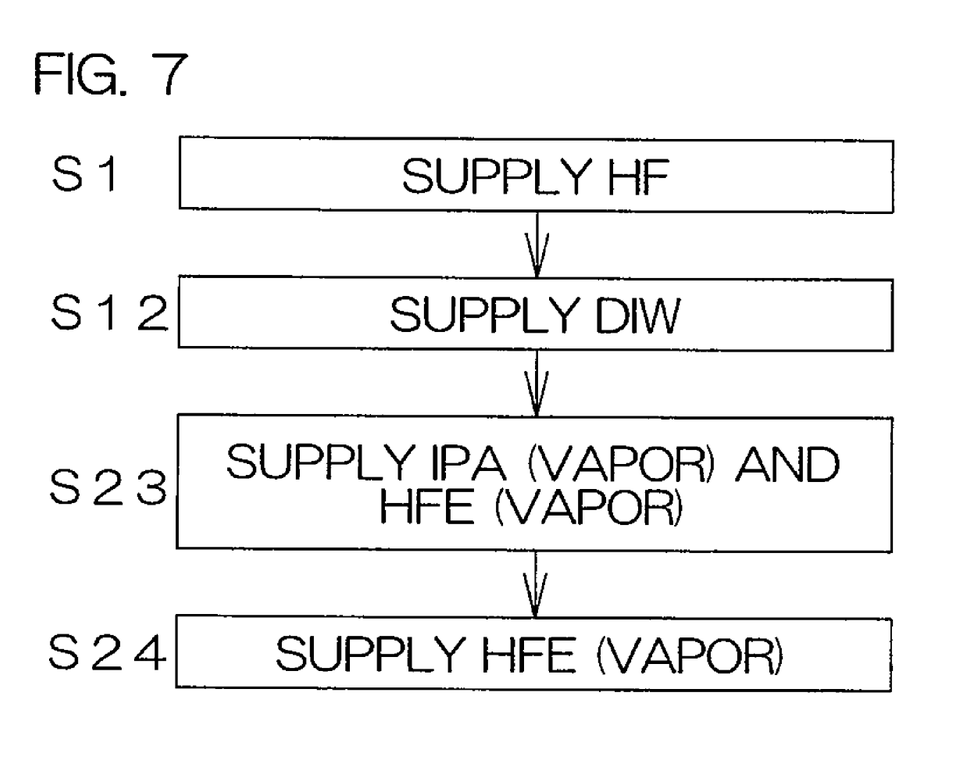
FIG. 7 is a flowchart showing another example of the processing applied to a wafer by the substrate processing apparatus of the second embodiment.

FIG. 7 is a flowchart showing another example of the processing applied to the wafer W by the substrate processing apparatus 1a of the second embodiment. In FIG. 7, the portions corresponding to the respective steps shown in FIG. 3 and FIG. 5 are labeled with the same reference numerals as those of the corresponding portions. Hereinafter, detailed descriptions of the respective portions labeled with the same reference numerals are omitted.

In the example of the wafer processing shown in FIG. 7, the same processing up to the cleaning processing (up to Step S12) as shown in FIG. 5 is applied.

When a supply of DIW has continued over a predetermined cleaning processing time, the control device 27 closes the first DIW valve 15 to stop the supply of DIW from the first nozzle 3, and closes the second DIW valve 44 to stop the supply of DIW from the lower nozzle 41. Subsequently, the control device 27 controls the first nozzle moving mechanism 11 to evacuate the first nozzle 3 from above the wafer W.

The control device 27 then controls the blocking plate elevation driving mechanism 38 to move down the blocking plate 28, so that the opposing surface 29 of the blocking plate 28 is located at a position in close proximity to the surface of the wafer W held by the spin chuck 2.

The control device 27 then opens the first evaporation valve 35 and the second evaporation valve 36 to supply the IPA vapor and the HFE vapor to the steam supply tube 32. The IPA vapor and the HFE vapor supplied to the steam supply tube 32 mix with each other in the steam supply tube 32 to form a steam of a mixed organic solvent. The IPA vapor and the HFE vapor are thus discharged toward the surface of the wafer W in the form of a steam of the mixed organic solvent from the opening in the opposing surface 29 by passing through the internal space of the supporting shaft 31. The steam of the mixed organic solvent thus discharged spreads toward the rim of the wafer W between the surface of the wafer W and the opposing surface 29. A space between the surface of the wafer W and the opposing surface 29 is therefore filled with the steam of the mixed organic solvent, and the steam of the mixed organic solvent is supplied across the entire surface of the wafer W (Step S23).

In this instance, the control device 27 controls the heater 30 to heat the blocking plate 28 to a predetermined temperature. To be more concrete, the temperature of the opposing surface 29 is raised to a temperature higher than the dew point of the mixed organic solvent by heating the blocking plate 28. Further, the control device 27 opens the nitrogen gas valve 46 to discharge a nitrogen gas toward the vicinity of the rotation center on the back surface of the wafer W from the nitrogen gas discharge port. The nitrogen gas thus discharged spreads toward the rim of the wafer W between the back surface of the wafer W and the top surface of the spin base 6a. A space between the back surface of the wafer W and the top surface of the spin base 6a is therefore filled with the nitrogen gas, and the nitrogen gas is supplied across the entire back surface of the wafer W. The wafer W to which is supplied the nitrogen gas is cooled by the supply of the nitrogen gas and rotations of the wafer W by the spin chuck 2. The control device 27 controls an amount of supply of the nitrogen gas and the rotation speed of the wafer W, so that the temperature on the surface of the wafer W stays at or below the dew point of the mixed organic solvent.

The steam of the mixed organic solvent supplied to the surface of the wafer W forms dew condensation on the surface of the wafer W and is thereby supplied to the surface of the wafer W as a liquid of the mixed organic solvent having a high purity and containing no moisture. By continuing the supply of the steam of the mixed organic solvent and the liquid of the mixed organic solvent to the surface of the wafer W, the concentration of the mixed organic solvent in DIW remaining on the surface of the wafer W after the cleaning processing increases, and DIW is eventually substituted by the liquid of the mixed organic solvent.

In this instance, because the temperature of the opposing surface 29 is set to a temperature higher than the dew point of the mixed organic solvent, it is possible to suppress the steam of the mixed organic solvent present between the surface of the wafer W and the opposing surface 29 from being consumed by forming dew condensation on the opposing surface 29. It is therefore possible to supply the steam of the mixed organic solvent efficiently to the surface of the wafer W. In addition, because the opposing surface 29 of the blocking plate 28 is brought into close proximity to the surface of the wafer W, it is possible to suppress the steam of the mixed organic solvent from diffusing above the wafer W. The concentration of the steam of the mixed organic solvent in a space between the surface of the wafer W and the opposing surface 29 is therefore maintained at high concentration. It is thus possible to supply the steam of the mixed organic solvent efficiently to the surface of the wafer W.

When a supply of the steam of the mixed organic solvent is continued over a predetermined processing time, the control device 27 closes the first steam valve 35 to stop the supply of the IPA vapor to the steam supply tube 32. Accordingly, the HFE vapor alone is supplied to the steam supply tube 32, which allows the HFE vapor alone to be supplied to the surface of the wafer W (Step S24).

In this instance, the control device 27 controls the heater 30 to set the temperature of the opposing surface 29 to a temperature higher than the dew point of HFE. Further, the control device 27 controls the rotation speed of the wafer W by the spin chuck 2 and an amount of supply of the nitrogen gas to the back surface of the wafer W to cool the wafer W, so that the temperature on the surface of the wafer W stays at or below the dew point of HFE.

Because the temperature on the surface of the wafer W is set to or below the dew point of HFE, the HFE vapor supplied to the surface of the wafer W forms dew condensation on the surface of the wafer W and is thereby supplied to the surface of the wafer W in the form of a liquid of HFE having a high purity and containing no moisture. By continuing the supply of the HFE vapor and the liquid of the HFE to the surface of the wafer W, the concentration of HFE in the mixed organic solvent (liquid) on the surface of the wafer W increases, while DIW dissolved into IPA contained in the mixed organic solvent and the mixed organic solvent evaporates. The mixed organic solvent on the surface of the wafer W is thus eventually substituted by the liquid of HFE. Accordingly, DIW remaining on the surface of the wafer W after the cleaning processing is removed completely from the surface of the wafer W.

In this instance, because the temperature of the opposing surface 29 is set to a temperature higher than the dew point of HFE, it is possible to suppress the HFE vapor present between the surface of the wafer W and the opposing surface 29 from being consumed by dew condensation on the opposing surface 29. It is thus possible to supply the HFE vapor efficiently to the surface of the wafer W. Further, because the opposing surface 29 of the blocking plate 28 is brought into close proximity to the surface of the wafer W, it is possible to suppress the HFE vapor from diffusing above the wafer W. The concentration of the HFE vapor in the space between the surface of the wafer W and the opposing surface 29 is therefore maintained at high concentration. It is thus possible to supply the HFE vapor efficiently to the surface of the wafer W.

By continuing the supply of the HFE vapor to the surface of the wafer W, as has been described, the mixed organic solvent on the surface of the wafer W is substituted by the liquid of HFE. After the mixed organic solvent is substituted by the liquid of HFE, the liquid of HFE on the surface of the wafer W evaporates due to heat energy of the HFE vapor subsequently supplied and the volatility of HFE, and the wafer W is dried. In this instance, because the HFE vapor is heated by the heater 37, the volatility thereof is increased. It is thus possible to dry the wafer W in a shorter time satisfactorily.

When the wafer W is dried by continuing the supply of the HFE vapor over a predetermined processing time, the control device 27 closes the second steam valve 36 to stop the supply of the HFE vapor to the surface of the wafer W. Subsequently, the control device 27 controls the blocking plate rotation driving mechanism 39 to stop rotations of the blocking plate 28, and controls the blocking plate elevation driving mechanism 38 to evacuate the blocking plate 28 far above from the spin chuck 2. Further, the control device 27 closes the nitrogen gas valve 46 to stop the supply of the nitrogen gas to the back surface of the wafer W, and controls the chuck rotation driving mechanism 8 to stop rotations of the wafer W. The processed wafer W is then transported by the delivery robot not shown from the spin chuck 2.

Figure 8:
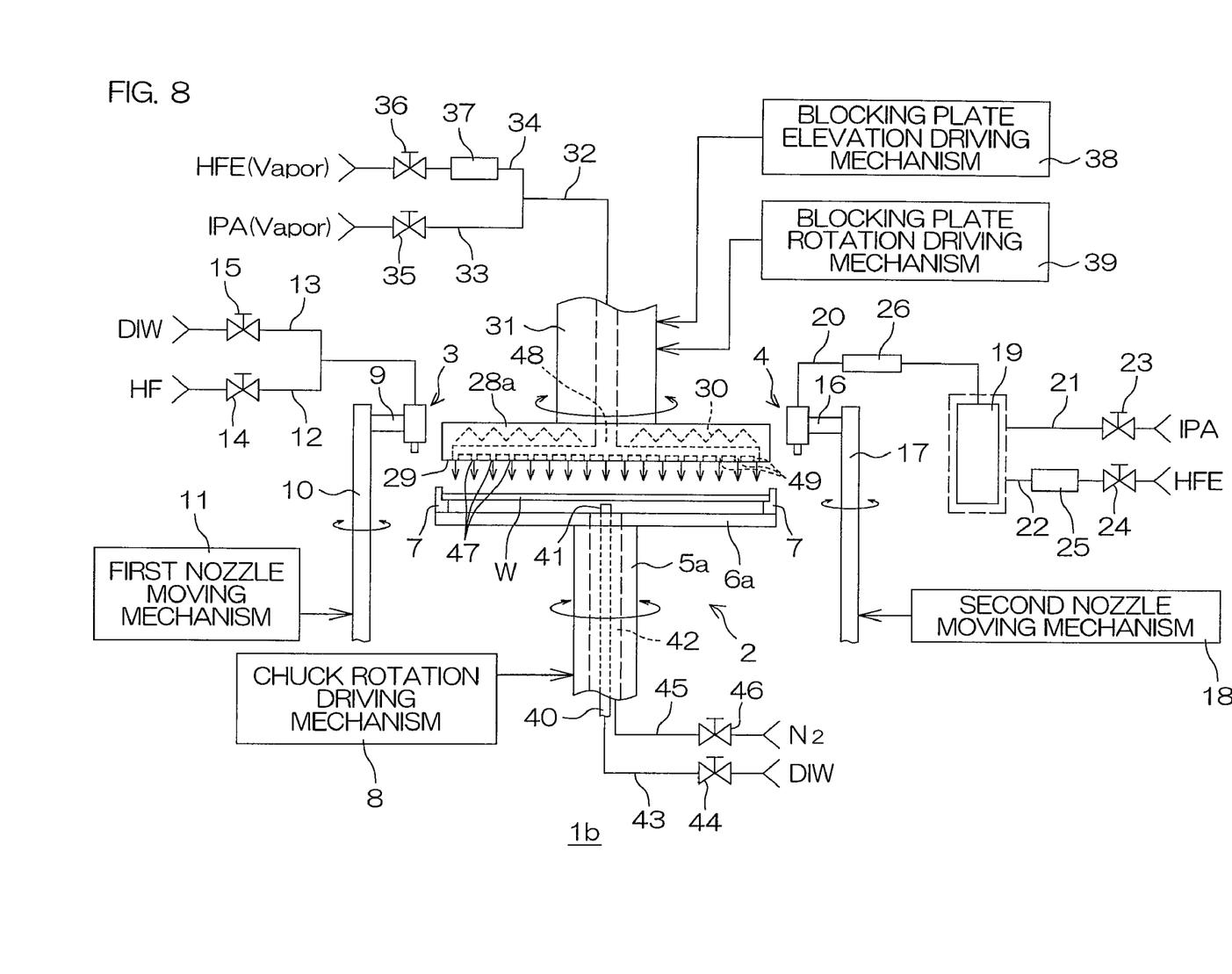
FIG. 8 is schematic view describing the configuration of a substrate processing apparatus according to a third embodiment of the invention.

FIG. 8 is a schematic view describing the configuration of a substrate processing apparatus 1b according to a third embodiment of the invention. In FIG. 8, portions corresponding to the respective portions shown in FIG. 4 are labeled with the same reference numerals as those of the corresponding portions. Hereinafter, detailed descriptions of the respective portions labeled with the same reference numerals are omitted.

A major difference between the configuration of the substrate processing apparatus 1b of FIG. 8 and the configuration of the substrate processing apparatus 1a of FIG. 4 is that plural steam discharge ports 47 for discharging a steam of an organic solvent are formed homogenously across the entire opposing surface 29. Further, a blocking plate 28a is formed with a steam channel 48 that communicates with the internal space of the supporting shaft 31 and plural branch steam channels 49 that branch from the steam channel 48 and communicate with the corresponding steam discharge ports 47.

In the third embodiment, by discharging a steam of an organic solvent (a steam of the IPA vapor, the HFE vapor, or the mixed organic solvent) from the plural steam discharge ports 47 toward the surface of the wafer W, it is possible to supply the vapor of the organic solvent homogeneously to the surface of the wafer W. Hence, because the steam of the mixed organic solvent can be supplied homogeneously to the surface of the wafer W from the plural steam discharge ports 47, it is possible to substitute the liquid of the mixed organic solvent for DIW remaining on the surface of the wafer W after the cleaning processing more reliably. Further, because the HFE vapor can be supplied homogeneously to the surface of the wafer W from the plural steam discharge ports 47, it is possible to substitute the liquid of HFE for the liquid of the mixed organic solvent on the surface of the wafer W more reliably.

It should be appreciated that the invention is not limited to the contents of the embodiments described above, and various modifications are possible within the scope of claims. For example, the example of the processing detailed in FIG. 3 described a case where the wafer W is dried by the spin dry processing after the supply of HFE. However, the wafer W may be dried by evaporating HFE using the volatility of HFE alone without rotating the wafer W.

Further, the examples of the processing detailed in FIG. 5 and FIG. 7 described a case where the wafer W is cooled by supplying a nitrogen gas to the back surface of the wafer W while rotating the wafer W. However, the wafer W may be cooled by supplying DIW to the back surface of the wafer W from the lower nozzle 41. In this instance, the wafer W may be rotated or may not be rotated. Further, a nitrogen gas may be supplied or may not be supplied to the back surface of the wafer W. In addition, a nitrogen gas supplied to cool the wafer W may be cooled in advance.

Still further, the examples of processing detailed above described a case where the mixed organic solvent (liquid or steam) is supplied to the surface of the wafer W after the cleaning processing is applied to the surface. However, IPA alone as a fluid of a water-soluble organic solvent may be supplied before a supply of the mixed organic solvent. In this case, IPA supplied to the surface of the wafer W can be in the form of either a liquid or a steam.

The examples of the processing mentioned above describe a case where the heated mixed organic solvent (liquid or steam) and HFE (liquid or steam) are supplied to the surface of the wafer W. However, the organic solvents may not be heated and the organic solvents at a room temperature state may be supplied to the surface of the wafer W. When HFE at a room temperature state is supplied to the surface of the wafer W to which the mixed organic solvent is supplied, HFE thus supplied evaporates gradually while the liquid of the mixed organic solvent and DIW on the surface of the wafer W are dissolved therein. Hence, in comparison with a case where heated HFE is supplied, HFE at a room temperature can facilitate to remove DIW completely from the surface of the wafer W.

The second and third embodiments mentioned above describe a case where the IPA vapor, which is a steam of IPA, and the HFE vapor, which is a steam of HFE, are used. However, an IPA vapor and an HFE vapor containing a nitrogen gas as a carrier gas may be used as well.

The first through third embodiments mentioned above describe a case where fluoric acid is used as a chemical. However, the chemical is not limited to fluoric acid, and a solution containing at least one kind among sulfuric acid, acetic acid, nitric acid, hydrochloric acid, fluoric acid, ammonia water, and hydrogen peroxide solution can be used as the chemical.

The first through third embodiments mentioned above describe a case where IPA is used as an example of a fluid of a water-soluble organic solvent. However, a fluid of the water-soluble organic solvent is not limited to IPA, and for example, a fluid of other water-soluble organic solvents, such as methanol, ethanol, acetone, and Trans-1,2-dichloroethylene, can be used as well.

In a case where Trans-1,2-dichloroethylene is used as a fluid of the water-soluble organic solvent, HFE and Trans-1, 2-dichloroethylene may account for 50% and 50%, respectively, of a fluid of the mixed organic solvent supplied to the surface of the wafer W on the basis of volume. In a case where fluids of two water-soluble organic solvents, such as Trans-1,2-dichloroethylene and ethanol, are used as a fluid of the water-soluble organic solvent, supply tubes, valves, and the like (not shown) may be provided for fluids of the respective water-soluble organic solvents, and HFE, Trans-1, 2-dichloroethylene, and ethanol may account for 52.7%, 44.6%, and 2.7%, respectively, of the fluids of the mixed organic solvents supplied to the surface of the wafer W on the basis of volume.

The first through third embodiments mentioned above describe a case where the mixed organic solvent (liquid or steam) is heated by pre-heating HFE (liquid or steam) to be mixed with IPA (liquid or steam) by the heater 25 or the heater 37. However, a heater (not shown) may be provided to the processing solution supply tube 20 or the steam supply tube 32, so that IPA and HFE in a state of the mixed organic solvent is heated without pre-heating HFE.

Besides HFE, a heater (not shown) may be provided to the IPA supply tube 21 or the IPA steam supply tube 33, so that the mixed organic solvent is heated by pre-heating IPA to be mixed with HFE. However, because IPA is highly inflammable, it is preferable to heat HFE alone or the mixed organic solvent.

The first through third embodiments mentioned above describe an apparatus configured to process a substrate by supplying a processing solution to the surface of a substrate (wafer W) rotating while being held in an almost horizontal posture. However, the apparatus may be configured to process a substrate by supplying a processing solution to the surface of the substrate in a state of not rotating (non-rotating state). A substrate in a non-rotating state may be a substrate in a state where it is neither rotating nor moving (rest state) or a substrate in a state where it is not rotating but moving in a predetermined direction (moving state).

The first through third embodiments mentioned above describe the wafer W as a substrate subjected to processing. However, a substrate subjected to processing is not limited to the wafer W, and other kinds of substrate may be subjected to processing, such as a substrate for liquid crystal display, a substrate for plasma display, a substrate for FED, an optical disk substrate, a magnetic disk substrate, a magneto optical disk substrate, a photomask substrate, and a ceramic substrate.

While the embodiments of the invention have been described in detail, it should be appreciated that these embodiments represent examples to provide clear understanding of the technical contents of the invention, and the invention is not limited to these examples. The sprit and the scope of the invention, therefore, are limited solely by the scope of the appended claims.

This application is based upon a prior Japanese Patent Application No. 2006-340206 filed with the Japanese Patent Office on Dec. 18, 2006, the entire contents of which are incorporated herein by reference.

What is claimed is:

1. A substrate processing method, comprising:
   a cleaning processing step of cleaning a main surface of a substrate by supplying deionized water to the substrate;
   a mixed organic solvent supplying step of supplying a fluid of a mixed organic solvent to the main surface of the substrate after the cleaning processing step, the fluid of the mixed organic solvent containing a fluid of a water-soluble organic solvent and a fluid of a fluorine organic solvent having a smaller surface tension than that of the deionized water and a lower water solubility than that of the fluid of the water-soluble organic solvent; and
   a fluorine organic solvent supplying step of supplying the fluid of the fluorine organic solvent to the main surface of the substrate without supplying the fluid of the water-soluble organic solvent after the mixed organic solvent supplying step, wherein
   the fluorine organic solvent supplying step includes a step of placing an opposing member having an opposing surface disposed such that the opposing surface is opposed to the main surface of the substrate, and a step of supplying a steam of the fluorine organic solvent to the main surface of the substrate by supplying the steam of the fluorine organic solvent between the main surface of the substrate and the opposing surface of the opposing member,
   the method further comprising:
   a step of setting, in parallel with the fluorine organic solvent supplying step, a temperature of the opposing surface of the opposing member above a dew point of the fluid of the fluorine organic solvent and setting a temperature on the main surface of the substrate to or below the dew point of the fluid of the fluorine organic solvent.

2. The substrate processing method according to claim 1, wherein:
   the fluid of the water-soluble organic solvent blends with the deionized water; and
   the fluid of the fluorine organic solvent does not blend with the deionized water.

3. The substrate processing method according to claim 1, wherein:
   the mixed organic solvent supplying step includes a step of heating the fluid of the mixed organic solvent to be supplied to the main surface of the substrate.

4. The substrate processing method according to claim 1, wherein:
   the fluorine organic solvent supplying step includes a step of heating the fluid of the fluorine organic solvent to be supplied to the main surface of the substrate.

5. The substrate processing method according to claim 1, wherein the water-soluble organic solvent includes at least one selected from a group consisting of methanol, ethanol, IPA (isopropyl alcohol), acetone, and trans-1,2-dichloroethylene.

6. The substrate processing method according to claim 1, wherein the fluorine organic solvent includes HFE (hydrofluoroether).

7. A substrate processing method, comprising:
   a cleaning processing step of cleaning a main surface of a substrate by supplying deionized water to the substrate;
   a mixed organic solvent supplying step of supplying a fluid of a mixed organic solvent to the main surface of the substrate after the cleaning processing step, the fluid of the mixed organic solvent containing a fluid of a water-soluble organic solvent and a fluid of a fluorine organic solvent having a smaller surface tension than that of the deionized water and a lower water solubility than that of the fluid of the water-soluble organic solvent; and
   a fluorine organic solvent supplying step of supplying the fluid of the fluorine organic solvent to the main surface of the substrate without supplying the fluid of the water-soluble organic solvent after the mixed organic solvent supplying step, wherein
   the mixed organic solvent supplying step includes a step of placing an opposing member having an opposing surface disposed such that the opposing surface is opposed to the main surface of the substrate, and a step of supplying a steam of a mixed organic solvent containing a steam of the water-soluble organic solvent and a steam of the fluorine organic solvent to the main surface of the substrate by supplying the steam of the mixed organic solvent between the main surface of the substrate and the opposing surface of the opposing member,
   the method further comprising:
   a step of setting, in parallel with the mixed organic solvent supplying step, a temperature of the opposing surface of the opposing member above a dew point of the fluid of the mixed organic solvent and setting a temperature on the main surface of the substrate to or below the dew point of the fluid of the mixed organic solvent.

8. The substrate processing method according to claim 7, wherein:
   the fluid of the water-soluble organic solvent blends with the deionized water; and
   the fluid of the fluorine organic solvent does not blend with the deionized water.

9. The substrate processing method according to claim 7, wherein:
   the mixed organic solvent supplying step includes a step of heating the fluid of the mixed organic solvent to be supplied to the main surface of the substrate.

10. The substrate processing method according to claim 7, wherein:
    the fluorine organic solvent supplying step includes a step of heating the fluid of the fluorine organic solvent to be supplied to the main surface of the substrate.

11. The substrate processing method according to claim 7, wherein the water-soluble organic solvent includes at least one selected from a group consisting of methanol, ethanol, IPA (isopropyl alcohol), acetone, and trans-1,2-dichloroethylene.

12. The substrate processing method according to claim 7, wherein the fluorine organic solvent includes HFE (hydrofluoroether).

* * * * *